US011514990B1

United States Patent
Kumar et al.

(10) Patent No.: US 11,514,990 B1
(45) Date of Patent: Nov. 29, 2022

(54) TWO WAY SINGLE VREF TRIM FOR FULLY DIFFERENTIAL CDAC FOR ACCURATE TEMPERATURE SENSING

(71) Applicant: SANDISK TECHNOLOGIES LLC, Addison, TX (US)

(72) Inventors: Nittala Venkata Satya Somanadh Kumar, Bangalore (IN); Sridhar Yadala, Bangalore (IN); Anupam G N Choudhary, Bengaluru (IN); Addagalla Aswani Krishna Lakshminarayana, Andhra Pradesh (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/349,963

(22) Filed: Jun. 17, 2021

(51) Int. Cl.
*G11C 29/02* (2006.01)
*G11C 16/30* (2006.01)
*G11C 5/14* (2006.01)

(52) U.S. Cl.
CPC .............. *G11C 16/30* (2013.01); *G11C 5/147* (2013.01); *G11C 29/028* (2013.01)

(58) Field of Classification Search
CPC ........ G11C 16/30; G11C 5/147; G11C 29/028
See application file for complete search history.

(56) References Cited

U.S. PATENT DOCUMENTS

| 2012/0013410 A1* | 1/2012 | Rebel ...................... H03L 1/022 331/70 |
| 2014/0084989 A1* | 3/2014 | Fujime .................... G05F 1/575 327/513 |
| 2019/0178938 A1* | 6/2019 | Jin ...................... G01R 31/3167 |

FOREIGN PATENT DOCUMENTS

| CN | 107255529 A | * | 10/2017 | |
| JP | 5001488 B2 | * | 8/2012 | ............... G01D 3/02 |
| WO | WO-2005091869 A2 | * | 10/2005 | ........... G01R 35/005 |

* cited by examiner

*Primary Examiner* — Jay W. Radke
(74) *Attorney, Agent, or Firm* — Morgan, Lewis & Bockius, LLP

(57) ABSTRACT

A temperature sensing circuit of a data storage system includes a temperature sensor, a digital-to-analog circuit, and a reference generation and trimming circuit configured to generate a common mode voltage (VCM), a positive reference voltage (VREFP), and a negative reference voltage (VREFN) using a single band gap reference signal. The trimming circuit is configured to trim the VCM, VREFP, and VREFN by adjusting a VC trim signal to increase the VCM until a VCM error is below a threshold; adjusting a high temperature trim signal to increase the VREFP and decrease the VREFN until a digital temperature signal associated with the digital-to-analog circuit attains a predetermined accuracy level for a first temperature; and adjusting a low temperature trim signal to increase the VREFP, VCM, and VREFN until the digital temperature signal attains a predetermined accuracy level for a second temperature.

20 Claims, 14 Drawing Sheets

TWO WAY SINGLE VREF TRIM FOR FULLY DIFFERENTIAL CDAC FOR ACCURATE TEMPERATURE SENSING

TECHNICAL FIELD

The present description relates in general to temperature sensing circuitry in data storage systems, and more particularly to methods of trimming digitization circuitry associated with such temperature sensing circuitry.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

One way to increase efficiencies of non-volatile memories is to increase the accuracy and performance of the temperature sensing circuitry and related digitization circuitry (DAC). Fully differential capacitive DACs may be a good choice for implementing in temperature sensing circuitry of non-volatile memory since they may be optimized to work in low area/low ICC applications and provide better accuracy for temperature sensors. In general, these structures need to be trimmed in order to prevent random residual errors in these structures that lead to differential and integral nonlinearity for the overall ADC resolution, which cannot be controlled or estimated in overall error control.

This disclosure addresses new ways of controlling residual errors independent of fully differential structures with a novel reference voltage generation and trimming scheme to support trimming at high and low temperatures, where all references are derived and trimmed from the same ladder in loop circuitry. Overall error may be limited to less than 0.5 LSB.

Compared to trimming approaches involving the trimming of sensitive nodes of a capacitor bank, the trimming circuitry and scheme described herein trims out all errors within the loop until the target temperature code is achieved.

In one aspect, a temperature sensing circuit of a data storage system includes a temperature sensor configured to output an analog temperature signal proportional to a temperature proximate to a plurality of memory cells of the data storage system; an analog-to-digital circuit (ADC) configured to convert the analog temperature signal to a digital temperature signal using a common mode voltage (VCM), a positive reference voltage (VREFP), and a negative reference voltage (VREFN); and a reference generation and trimming circuit configured to (i) generate the VCM, VREFP, and VREFN using a single band gap reference signal, and (ii) trim the VCM, VREFP, and VREFN.

In some implementations, the reference generation and trimming circuit is configured to trim the VCM by adjusting a VC trim signal to increase the VCM until a VCM error is below a threshold.

In some implementations, the reference generation and trimming circuit is configured to trim the VREFP and the VREFN for a first temperature (e.g., a high temperature) by adjusting a high temperature trim signal to increase the VREFP and decrease the VREFN until the digital temperature signal attains a predetermined accuracy level for the first temperature.

In some implementations, the reference generation and trimming circuit is configured to trim the VREFP and the VREFN for a second temperature (e.g., a low temperature) by adjusting a low temperature trim signal to increase the VREFP, VCM, and VREFN until the digital temperature signal attains a predetermined accuracy level for the second temperature.

In some implementations, the ADC is configured to convert the analog temperature signal to the digital temperature signal by: determining whether the analog temperature signal is above or below VCM; and increasing VREFN in accordance with a determination that the analog temperature signal is above VCM or decreasing VREFP, or decreasing VREFP in accordance with a determination that the analog temperature signal is below VCM.

In some implementations, the reference generation and timing circuit is a loop of resistor ladders including a first resistor digital-to-analog conversion (RDAC) sub-circuit and a second RDAC sub-circuit in series with a negative feedback amplifier.

In some implementations, the first RDAC is configured to trim the VREFP based on the high temperature trim signal, and the second RDAC is configured to trim the VREFN based on the high temperature trim signal.

In some implementations, a portion of loop current outputted by the second RDAC is conveyed to the negative input terminal of the negative feedback amplifier.

In some implementations, the ADC is configured to convey the digital temperature signal to control circuitry of the data storage system; and the data storage system is configured to bias a program voltage or a read voltage based on the digital temperature signal.

In some implementations, the ADC includes a bank of capacitors arranged in a symmetric layout, including a plurality of capacitors having a first capacitance on a first side of the bank being spatially matched to a plurality of capacitors having the first capacitance on a second side of the bank.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
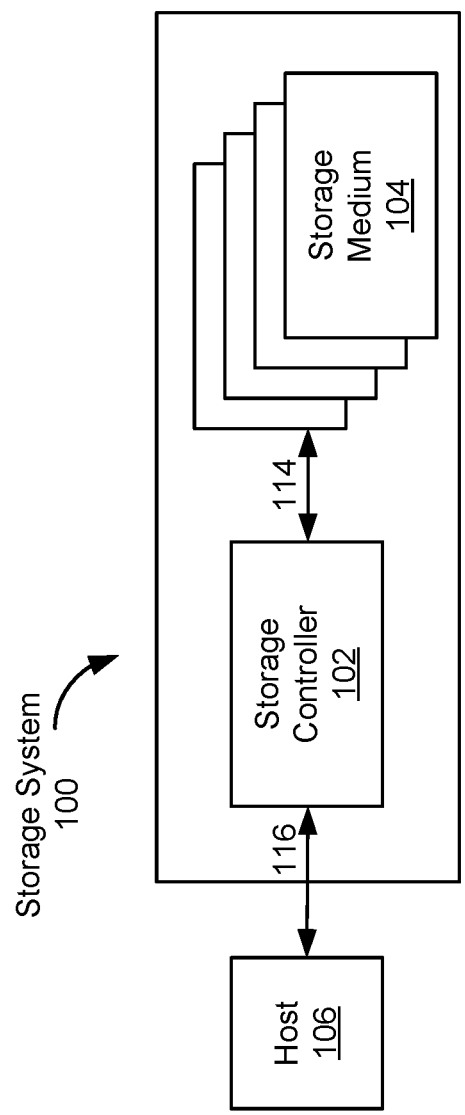
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate.

The storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104.

Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
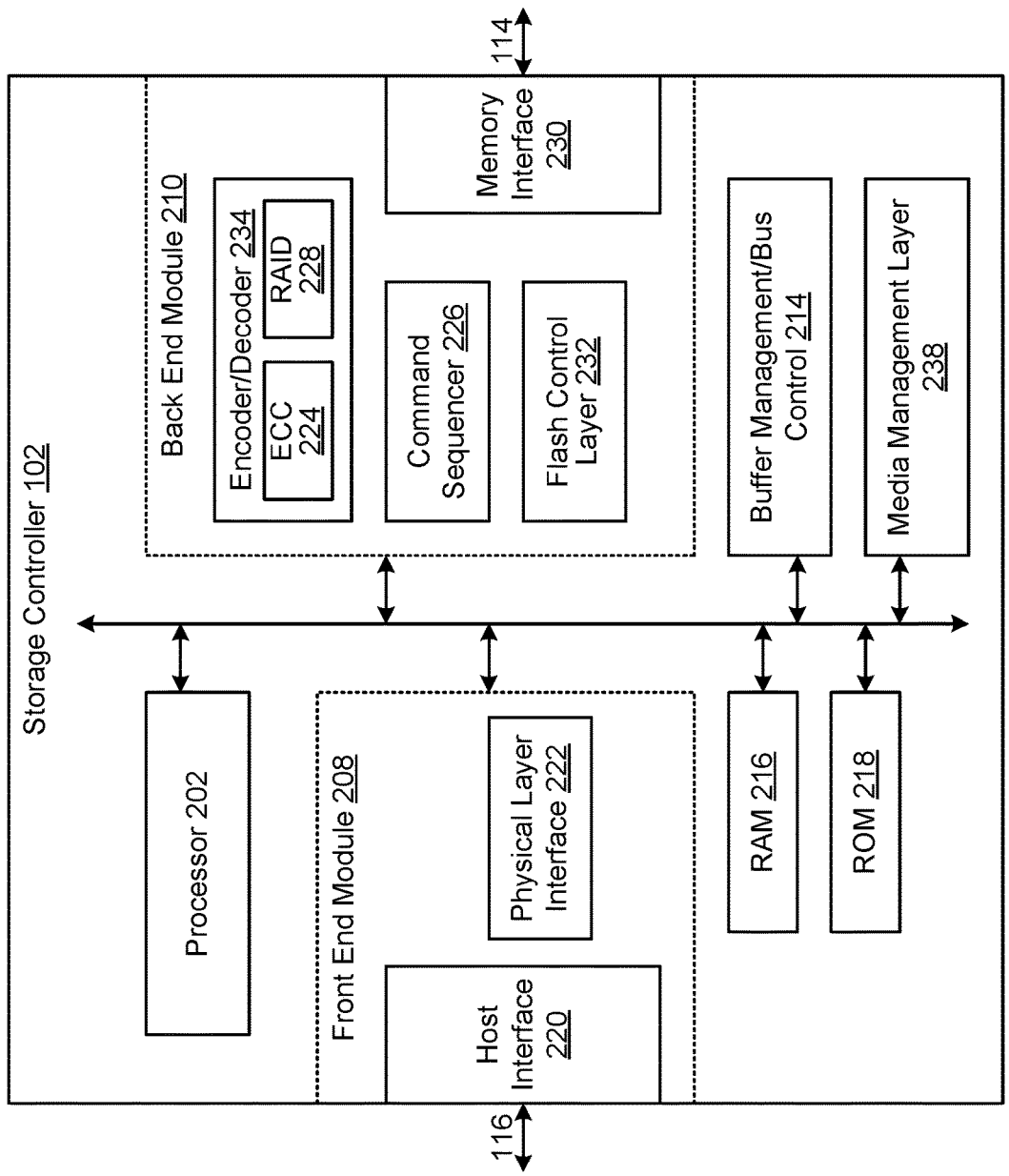
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro)processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system.

For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code.

Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals.

The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104.

In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104.

The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
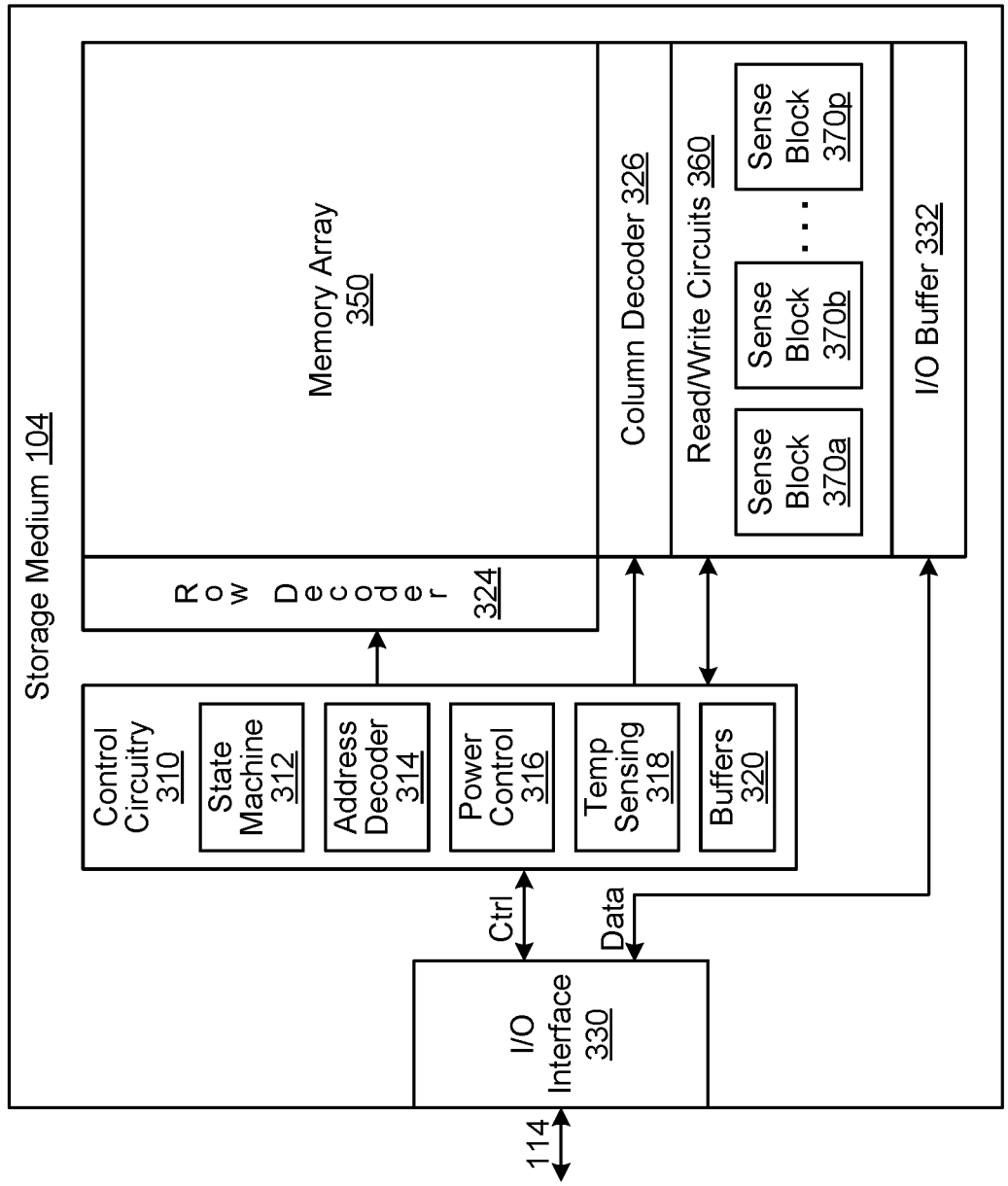
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330.

The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350.

The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells.

The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data.

The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature sensing circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature sensing circuit 318 may be configured to detect temperature in or around the storage medium 104. The temperature sensing circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature sensing circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates.

The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein.

Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
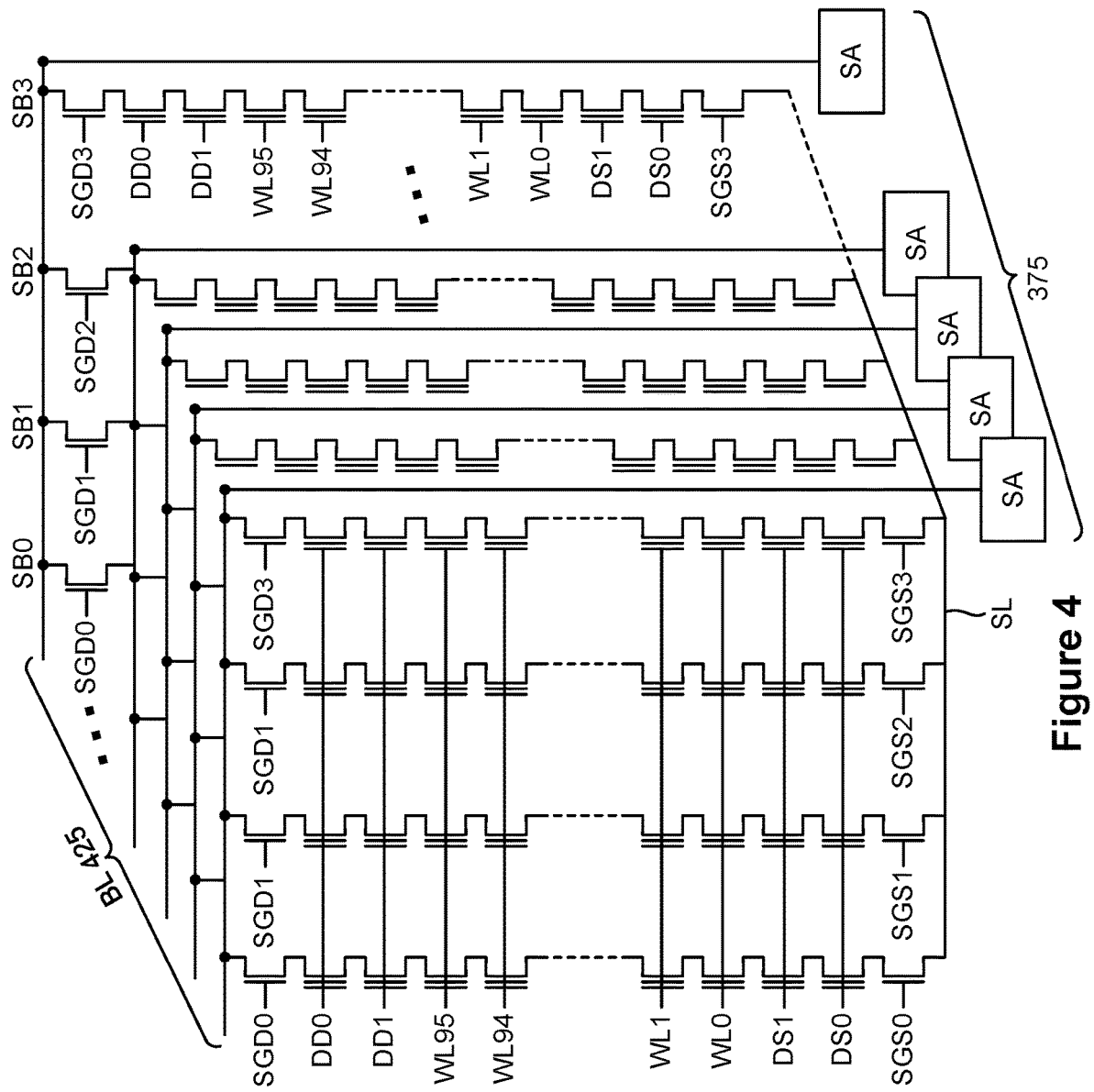
FIG. 4 is a schematic diagram of a portion of the memory array 350 depicted in FIG. 3 in accordance with some implementations.

FIG. 4 is a schematic diagram of a portion of the memory array 350 depicted in FIG. 3 in accordance with some implementations. FIG. 4 shows physical word lines WLL0-WLL95 running across an entire block, and bit lines 425. Within the block, each bit line is connected to four NAND strings.

Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line SL.

The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers SA 375 in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5:
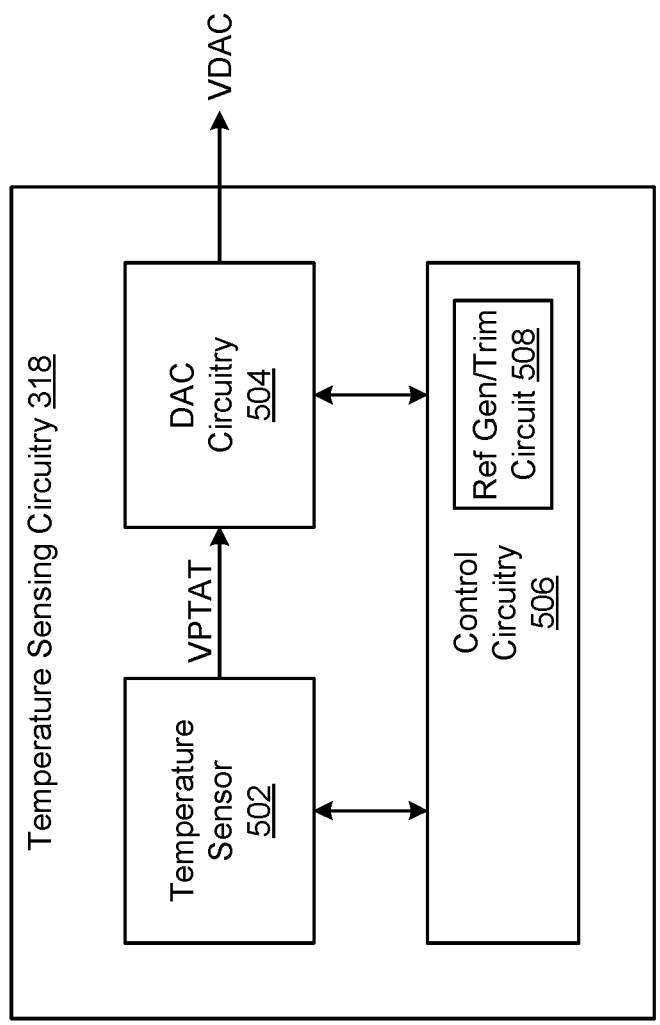
FIG. 5 is a block diagram of temperature sensing circuitry 318 (described above with reference to FIG. 3) in accordance with some implementations.

FIG. 5 is a block diagram of temperature sensing circuitry 318 (described above with reference to FIG. 3) in accordance with some implementations. Temperature sensing circuitry 318 includes a temperature sensor 502, digital analog converter (DAC) circuitry 504, and control circuitry 506, including reference generation and trimming circuit 508.

The temperature sensor 502 may include two or more diodes having different carrier densities. Alternatively, other temperature sensors may be used, as long as they are optimized for a given data storage application. The temperature sensor 502 outputs an analog voltage signal VPTAT (Voltage Proportional To Absolute Temperature) that is proportional to the absolute temperature in proximity to the storage medium 104.

The DAC circuitry 504 (alternatively referred to as ADC circuitry 504) is configured to convert the analog VPTAT signal to a digital signal VDAC that may be conveyed to other circuitry in the storage medium 104 (e.g., control circuitry 310). In some implementations, the DAC circuitry 504 implements a fully differential capacitive DAC (CDAC), as CDACs may be optimized for low area and low supply current (ICC) applications, and they provide good accuracy for temperature sensors.

The DAC circuitry 504 uses a plurality of reference voltages (described in more detail below) to convert the analog temperature signals VPTAT. Such reference voltages are subject to variances that may result in residual errors in the conversion process. Such errors may lead to differential nonlinearity (DNL) and integral nonlinearity (INL) for the overall ADC resolution which cannot be controlled or otherwise accounted for in error control and thus negatively affects accuracy of temperature readings.

The temperature sensing control circuitry 506 is configured to control the temperature sensing and conversion processes performed by the temperature sensor 502 and DAC circuitry 504. The control circuitry 506 includes a reference generation and trimming circuit 508, which is configured to trim the reference voltages used by the DAC circuitry 504 (described in more detail below). The trimming circuit addresses the aforementioned nonlinearities by removing or minimizing residual errors resulting from variances in the reference voltages used by the DAC circuitry 504.

Figure 6:
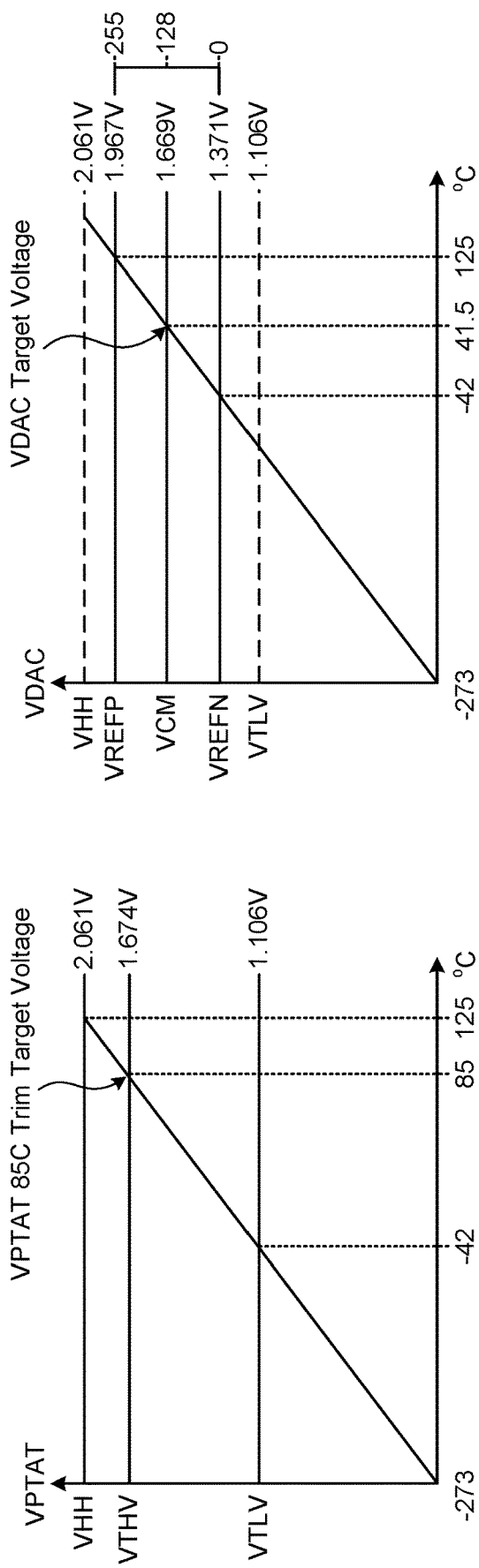
FIG. 6 depicts two graphs illustrating the relationship between analog voltage signal VPTAT, digital voltage VDAC, and reference voltages used by the DAC circuitry 504, including common mode voltage (VCM), positive reference voltage (VREFP), and negative reference voltage (VREFN) in accordance with some implementations.

FIG. 6 depicts two graphs illustrating the relationship between analog voltage signal VPTAT, digital voltage VDAC, and reference voltages used by the DAC circuitry 504, including common mode voltage (VCM), positive reference voltage (VREFP), and negative reference voltage (VREFN) in accordance with some implementations.

Trimming of the reference voltages is needed to adjust the slope of VDAC to match the slope of VPTAT. The temperature values VDAC are useful in the reading and writing circuitry of the storage medium 104 (e.g., control circuitry 310 and read/write circuits 360).

For example, the memory array 350 may be optimized for programming at one temperature (e.g., 85° C.) and reading at another temperature (e.g., −14° C.). Stated another way, the control circuitry 310 of the storage medium 104 needs to sense the temperature in proximity to the storage medium 104 and perform memory operations (read and program) at the right bias voltage for a given temperature for the memory array 350 to ensure precise program and read results. As such, accuracy of the digital temperature values output by the DAC circuitry 504 is essential to the operation of the storage medium 104.

As shown in FIG. 6, an operating window for VPTAT may be defined by a high temperature threshold voltage VHH and a low temperature threshold voltage VTLV, with a target (optimal) trim target voltage VTHV corresponding to, e.g., 85° C. Likewise, the VDAC signal may be associated with a target common mode voltage VCM corresponding to e.g., halfway between the low and high temperature threshold voltages, with the positive and negative reference voltages VREFP and VREFN corresponding to respective offsets from the high and low temperature threshold voltages VHH and VTLV.

Figure 7:
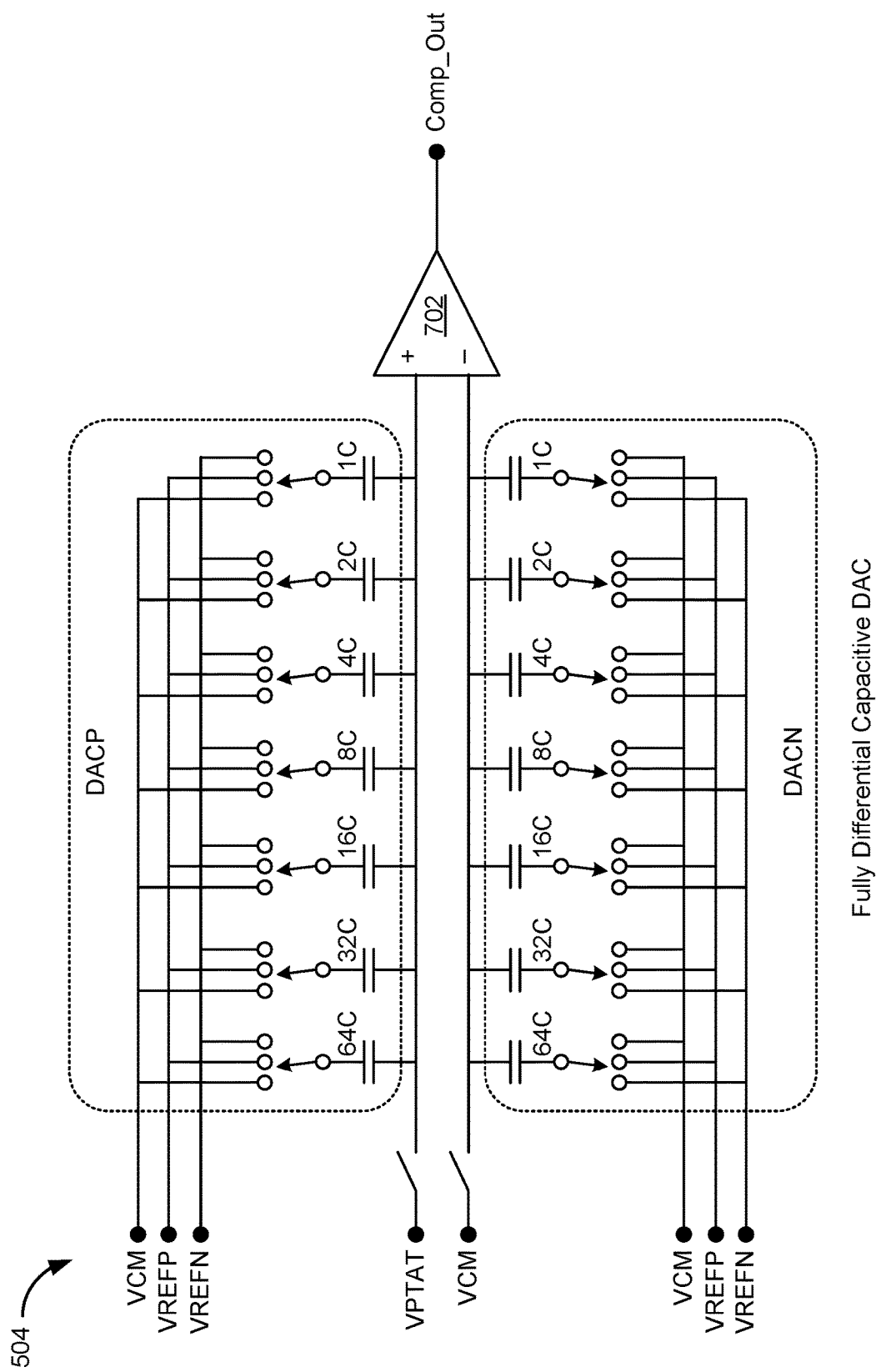
FIG. 7 is a diagram showing a detailed view of DAC circuitry 504 in accordance with some implementations.

FIG. 7 is a diagram showing a detailed view of DAC circuitry 504 in accordance with some implementations. The DAC 504 circuitry includes complementary DAC sub-circuits DACP and DACN, each including a plurality of capacitors connected to the reference voltages VCM, VREFP, and VREFN via respective switches. Input signals VPTAT and VCM are provided to a comparator 702 via the complementary DAC sub-circuits, and the comparator 702 outputs a result of the comparison Comp_Out.

The DAC circuitry 504 determines whether the analog temperature signal VPTAT is greater than or less than the common mode voltage reference VCM. If VPTAT is greater than VCM, Comp_Out=1. If VPTAT is less than VCM, Comp_Out=0. Once the comparison result is known (whether VPTAT is greater or less than VCM), the control circuitry 506 moves one of the reference voltages (REFP or REFN) closer to VCM.

For example, if VPTAT is greater than VCM, VREFN may be moved up to VCM since there is no need to search below VCM. Likewise, if VPTAT is less than VCM, VREFP may be moved down to VCM since there is no need to search above VCM. As such, the reference voltages VREFP and VREFN may be adjusted in order to narrow the search window for digitizing VPTAT.

In comparing VPTAT to the reference voltages VCM, VREFP, and VREFN, control circuitry 506 sets the switches in DACP and DACN to VCM, thereby connecting VPTAT and VCM to VCM (via the capacitor networks) in order to determine whether VPTAT is above or below VCM.

The control circuitry 506 sets the switches in DACP and DACN to VREFP, thereby connecting VPTAT and VCM to VREFP (via the capacitor networks) in order to adjust REFP and compare VPTAT to REFP to find the correct digital representation of VPTAT.

The control circuitry 506 sets the switches in DACP and DACN to VREFN, thereby connecting VPTAT and VCM to VREFN (via the capacitor networks) in order to adjust REFN and compare VPTAT to REFN to find the correct digital representation of VPTAT.

In some implementations, the DAC circuitry 504 may digitize the VPTAT signal to a resolution of 8 bits using the following temperature code equation:

$$Temp\ \text{Code Equation} = 128 + \left(\frac{VPTAT - VCM}{VREFP - VREFN}\right) * 128$$

In the above equation, the following example values may be used in order to optimize the temperature sensing circuitry 318 for 85° C.: VPTAT (voltage proportional to absolute temperature)=1.674V, with a resolution of 1.674/(273+85)=4.67 mV; VCM (common mode reference for fully differential schemes)=1.669V; VREFP (positive reference for max temperature resolution)=1.967V; and VREFN (negative reference for low temperature resolution)=1.371V.

Figure 8:
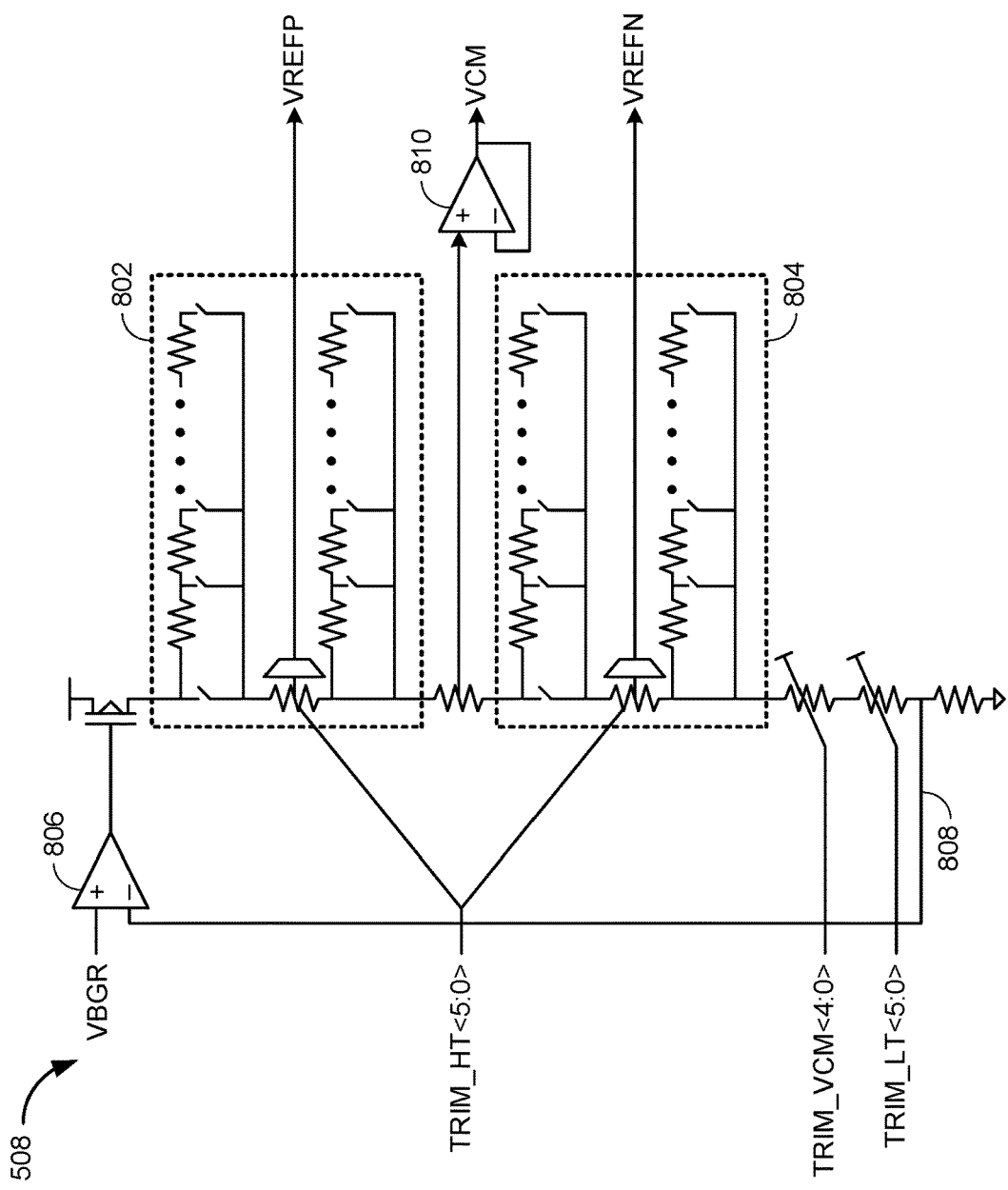
FIG. 8 is an example reference generation and trimming circuit 508 in accordance with some implementations.

FIG. 8 is an example reference generation and trimming circuit 508 in accordance with some implementations. The reference generation and trimming circuit 508 generates and trims the reference signals VCM, VREFP, and/or VREFN used by the DAC circuitry 504.

Trimming refers to the operations involved in initially calibrating certain signals in an electrical circuit. To trim a particular signal, the particular signal is provided to a circuit, and an output signal (caused by application of the particular signal) is compared to an ideal value. The particular signal being trimmed is successively adjusted until the output signal reaches, or comes within a predetermined threshold of, the ideal value.

Alternatively, to trim a particular signal, a trimming signal is provided to the circuit, causing the signal to be trimmed to be output from the circuit. The signal to be trimmed is compared to an ideal value. The trimming signal is successively adjusted until the signal to be trimmed reaches, or comes within a predetermined threshold of, the ideal value.

Circuit 508 includes a loop of resistor ladders implementing resistive DACs (RDACs), including a first RDAC 802 and a second RDAC 804. Each of the RDACs includes at least one resistor ladder (e.g., two resistor ladders as depicted in the figure).

The loop of resistor ladders of circuit 508 has a single input voltage signal VBGR (band gap reference signal), from which each of the reference voltage signals (VCM, VREFP, VREFN) is derived. In some implementations, VBGR may be set to, e.g., 0.9V. Other values may be used depending on the specific architecture and requirements for storage medium 104. In some implementations, VBGR is from scaled down from a higher voltage that is present in the storage medium 104 (e.g., scaled down from 1.2V).

The input voltage signal VBGR is provided to the loop of resistor ladders via a negative feedback amplifier 806, to which feedback 808 from the loop of resistor ladders is also provided.

Circuit 508 generates the reference voltage signals VCM, VREFP, and VREFN from the single source signal VBGR. Specifically, the input signal VBGR is conveyed to the loop of resistor ladders implementing the plurality of RDACs. As the signal passes through each RDAC, a different reference voltage is generated.

For example, a first RDAC 802 generates the positive reference voltage VREFP, a second RDAC 804 generates the negative reference voltage VREFN, and the common mode reference VCM is generated between the first and second RDACs 802 and 804. The commode mode reference VCM may be outputted through a buffer 810 in order to drive the required capacitive load resulting from VCM being conveyed to most of the capacitors in the DAC circuitry 504 (FIG. 7).

Circuit 508 trims the reference voltage signals VCM, VREFP, and VREFN using three trimming signals. The trimming signals include TRIM_VCM for trimming the common mode reference VCM, TRIM_HT for trimming the reference signals for high temperatures, and TRIM_LT for trimming the reference signals for low temperatures. The trimming signals are digital signals including a plurality of bits that are set by the control circuitry 506 in accordance with trimming scheme 900 (described in more detail below with reference to FIG. 9).

Circuit 508 trims the reference voltage signals VCM, VREFP, and VREFN in order to account for process variations in the storage medium 104. There may be four sources of errors in the temperature sensing circuitry 318: (i) residual error involved in generating and trimming VBGR; (ii) random offset of amplifier with beta ratio at VREFP, VREFN, VCM; (iii) parasitic capacitance on comparator inputs where DACP, DACN are connected; and (iv) comparator offset in loop for code resolution.

To address the aforementioned offsets and achieve the desired resolution for the DAC circuitry 504, circuit 508 generates and trims the reference voltages according to a trimming scheme as described below with reference to FIGS. 9-12.

Figure 9:
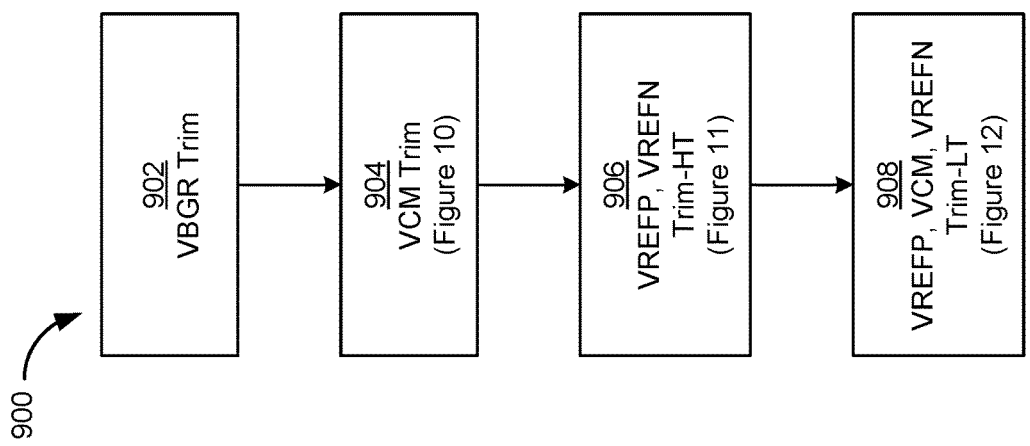
FIG. 9 is a flow diagram of a trimming method 900 in accordance with some implementations.

FIG. 9 is a flow diagram of a trimming method 900 in accordance with some implementations. The trimming method 900 is performed by the control circuitry 506, including the reference generation and timing circuit 508.

Trimming method 900 includes a sequence of trimming operations configured to achieve a desired resolution (e.g., 8 bits) for the digitization of analog temperature signal VPTAT in a manner that minimizes the four sources of errors in the temperature sensing circuitry 318 as described above.

Referring to FIG. 9, circuitry 506/508 trims (902) the input source signal VBGR. In some implementations, this trimming operation is performed by adjusting VBGR by a predetermined step size until the desired level has been reached. For example, circuitry configured to convert a 1.2V signal to a 0.9V VBGR input signal may be trimmed until the VBGR input signal has reached within a predetermined threshold of 0.9V.

Referring back to FIG. 9, subsequent to trimming the input signal VBGR, circuitry 506/508 trims (904) the common mode voltage reference VCM using the TRIM_HT digital trimming signal.

Figure 10:
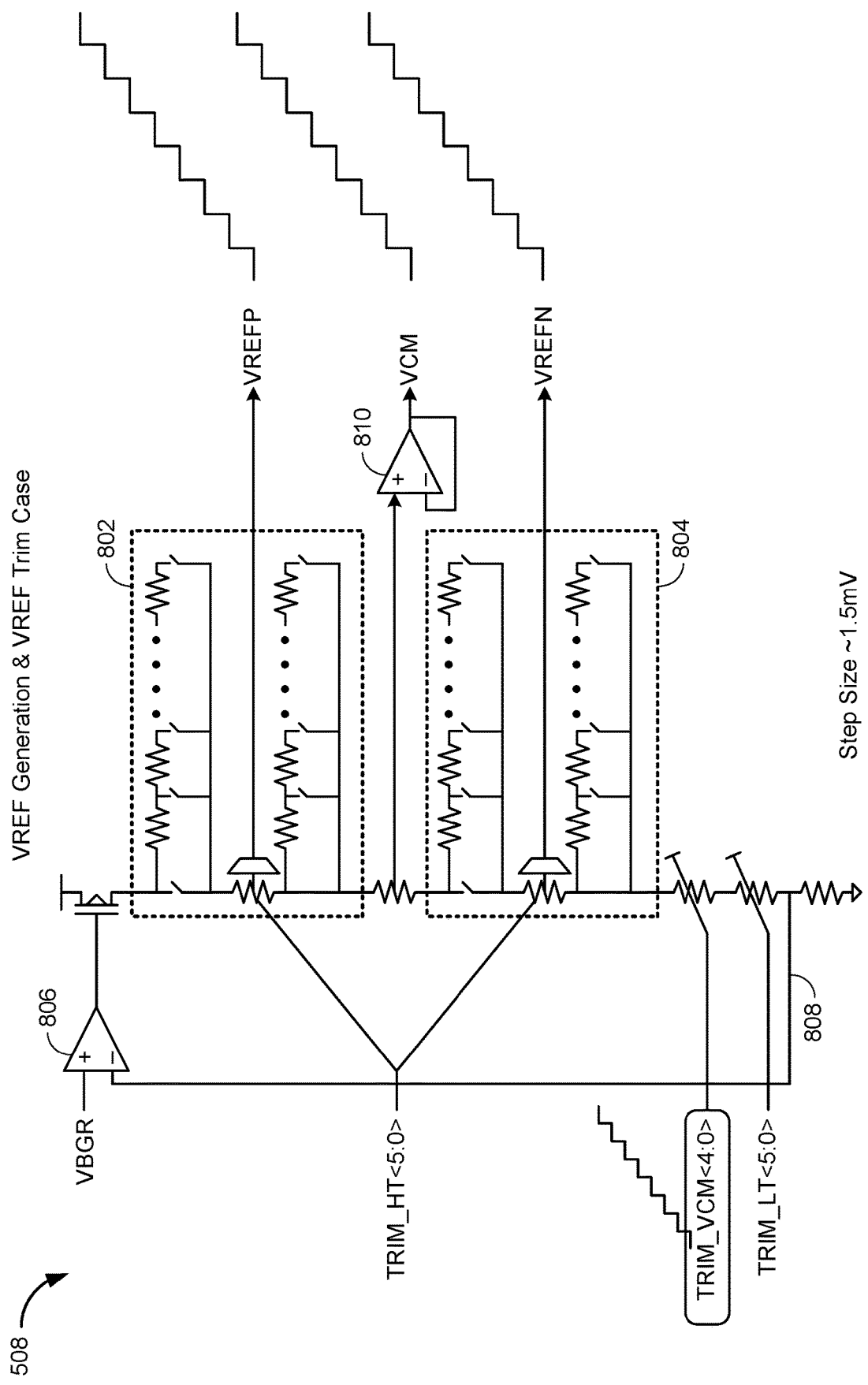
FIG. 10 is a diagram depicting reference trimming operation 904 in accordance with some implementations.

FIG. 10 is a diagram depicting reference trimming operation 904 in accordance with some implementations. Reference trimming operation 904 includes increasing the common mode trimming signal TRIM_VCM in a step-wise sequence, causing all three reference voltage signals (VREFP, VCM, VREFN) to increase in a step-wise sequence. Each time the common mode trimming signal TRIM_VCM is increased, the output of DAC circuitry 504 (the digitized temperature signal) is compared to a target temperature value. When the target temperature value is reached, VCM is properly trimmed and operation 904 is complete.

Referring back to FIG. 9, subsequent to trimming the common mode voltage reference VCM, circuitry 506/508 trims (906) reference voltages VREFP and VREFN for a high temperature using the TRIM_HT digital trimming signal.

Figure 11:
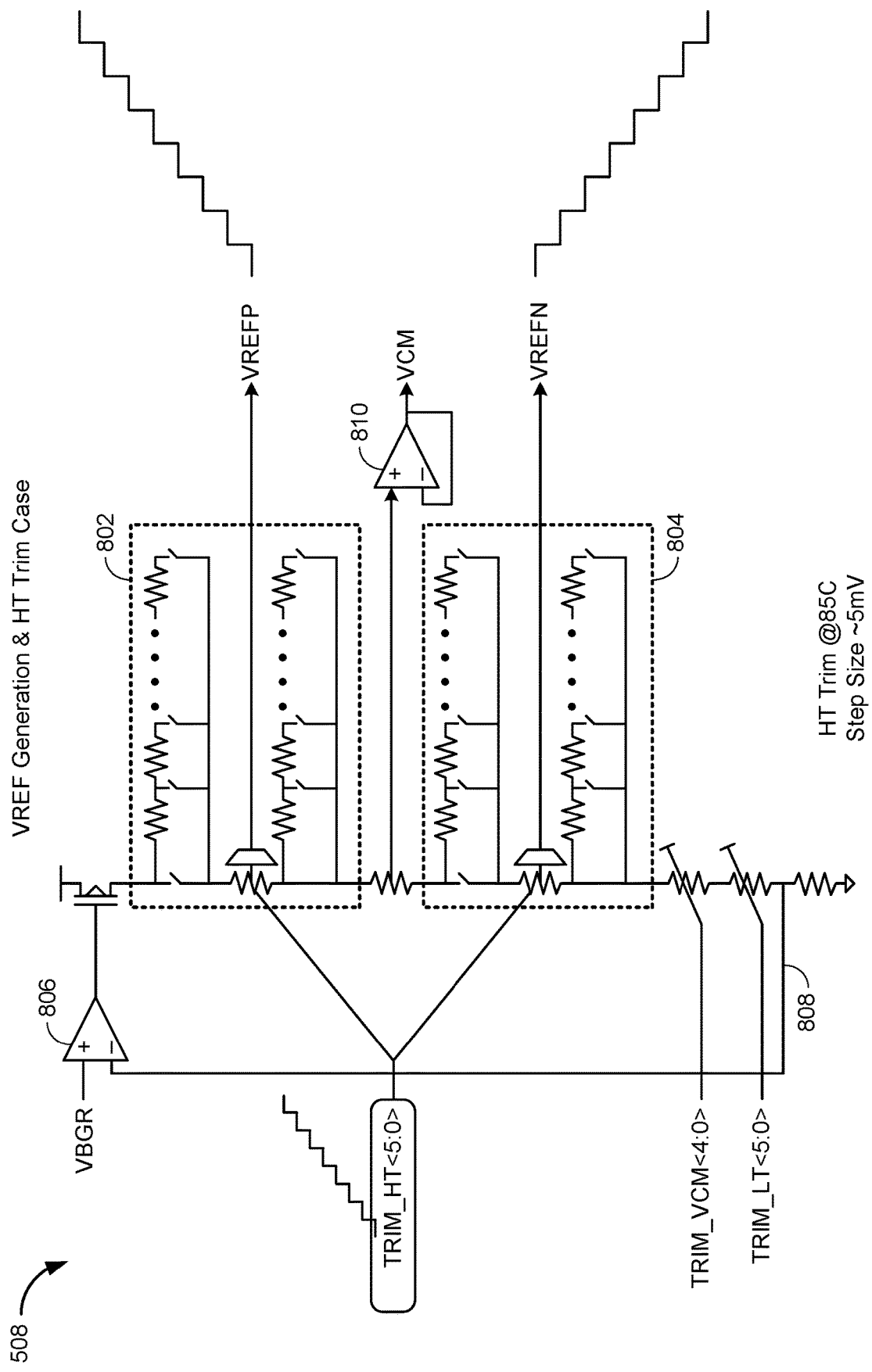
FIG. 11 is a diagram depicting high temperature trimming operation 906 in accordance with some implementations.

FIG. 11 is a diagram depicting high temperature trimming operation 906 in accordance with some implementations. Once VCM is trimmed (as a result of operation 904), circuitry 506/508 ensures that the DAC circuitry 504 outputs the correct temperature signal at a first temperature (e.g., 85° C.). To do this, reference trimming operation 906 includes trimming reference voltage signals VREFP and VREFN in opposite directions while leaving common mode reference signal VCM untouched.

Specifically, reference trimming operation 906 includes increasing the high temperature trimming signal TRIM_HT (which is inputted to the RDACs 802 and 804) in a step-wise sequence, causing reference voltage signal VREFP to increase and reference voltage signal VREFN to decrease in a step-wise sequence. Each time the high temperature trimming signal TRIM_HT is increased, the output of DAC circuitry 504 (the digitized temperature signal) is compared to a target temperature value. When the target temperature value is reached, VREFP and VREFN are properly trimmed for the high target temperature (e.g., 85° C.), and operation 906 is complete.

Referring back to FIG. 9, subsequent to trimming reference voltages VREFP and VREFN for a high temperature, circuitry 506/508 trims (908) reference voltages VREFP, VCM, and VREFN for a low temperature using the TRIM_LT digital trimming signal.

Figure 12:
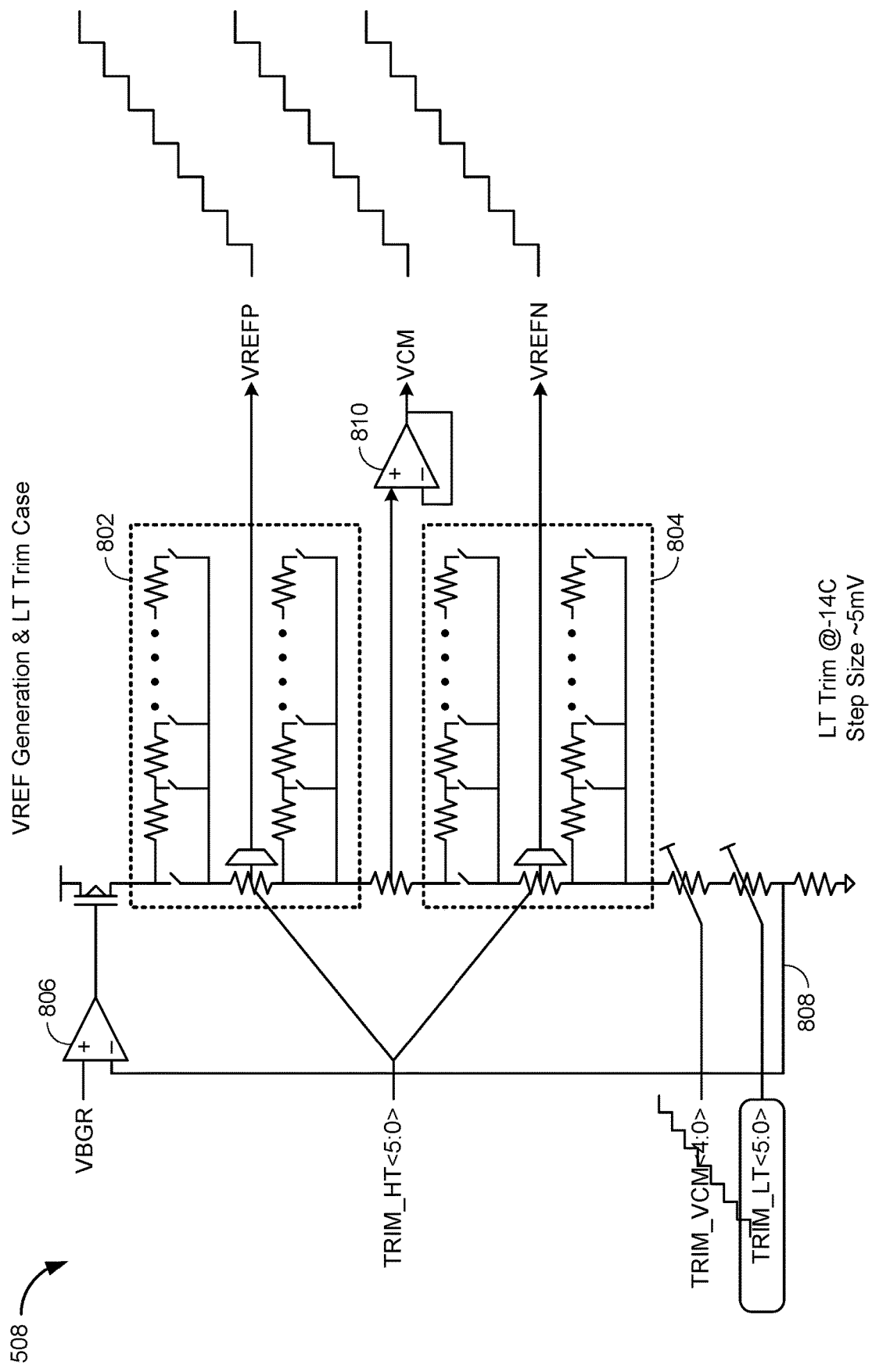
FIG. 12 is a diagram depicting low temperature trimming operation 908 in accordance with some implementations.

FIG. 12 is a diagram depicting low temperature trimming operation 908 in accordance with some implementations. Operation 908 is an additional trimming operation for a second temperature, to further refine the accuracy of the DAC circuitry 504.

Stated another way, once the reference voltage signals are trimmed for a first temperature in operation 906, circuitry 506/508 ensures that the DAC circuitry 504 outputs the correct temperature signal at a second temperature (e.g., −14° C.). To do this, reference trimming operation 908 includes trimming reference voltage signals VREFP, VCM, and VREFN in the same direction. The reference voltage signals must be trimmed in the same direction for low temperature trimming in order to compensate for non-linearity in VPTAT.

Specifically, reference trimming operation 908 includes increasing the low temperature trimming signal TRIM_LT in a step-wise sequence, causing all reference voltage signals (VREFP, VCM, VREFN) to increase in a step-wise sequence. Each time the low temperature trimming signal TRIM_LT is increased, the output of DAC circuitry 504 (the digitized temperature signal) is compared to a target temperature value. When the target temperature value is reached, VREFP and VREFN are properly trimmed for the low target temperature (e.g., −14° C.), and operation 908 is complete.

Trimming the reference voltage signals at a second temperature provides more flexibility to the DAC circuitry 504. Once the reference voltage signals are trimmed for two temperatures, a complete voltage swing with parasitics at the output of the DAC circuitry 504 may be obtained with accuracy above a required threshold (e.g., 8 bits).

Figure 13A:
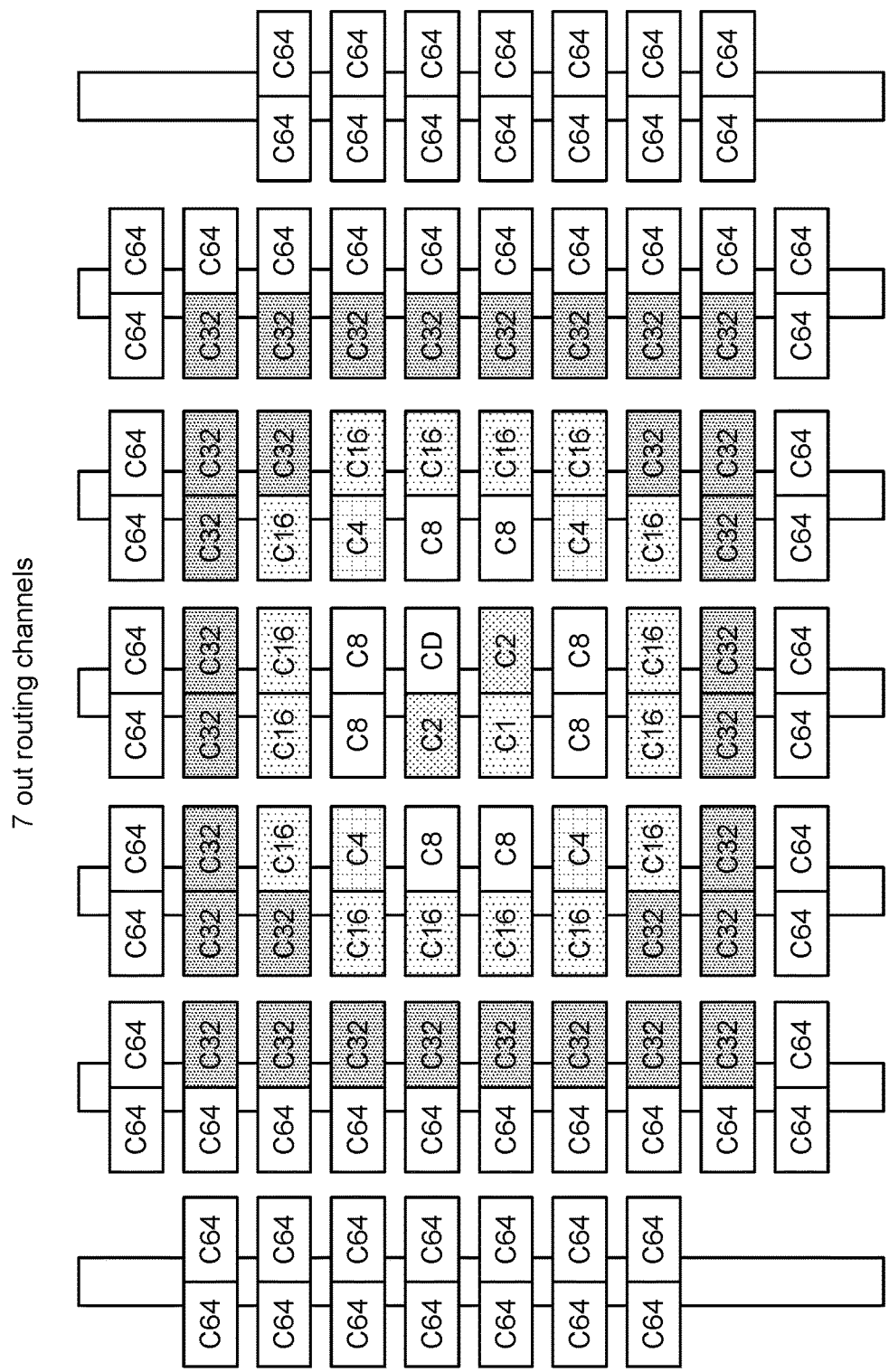
FIGS. 13A-13B are diagrams depicting layout matching patterns for the bank of capacitors of the CDAC circuitry 504 in accordance with some implementations.
Figure 13B:
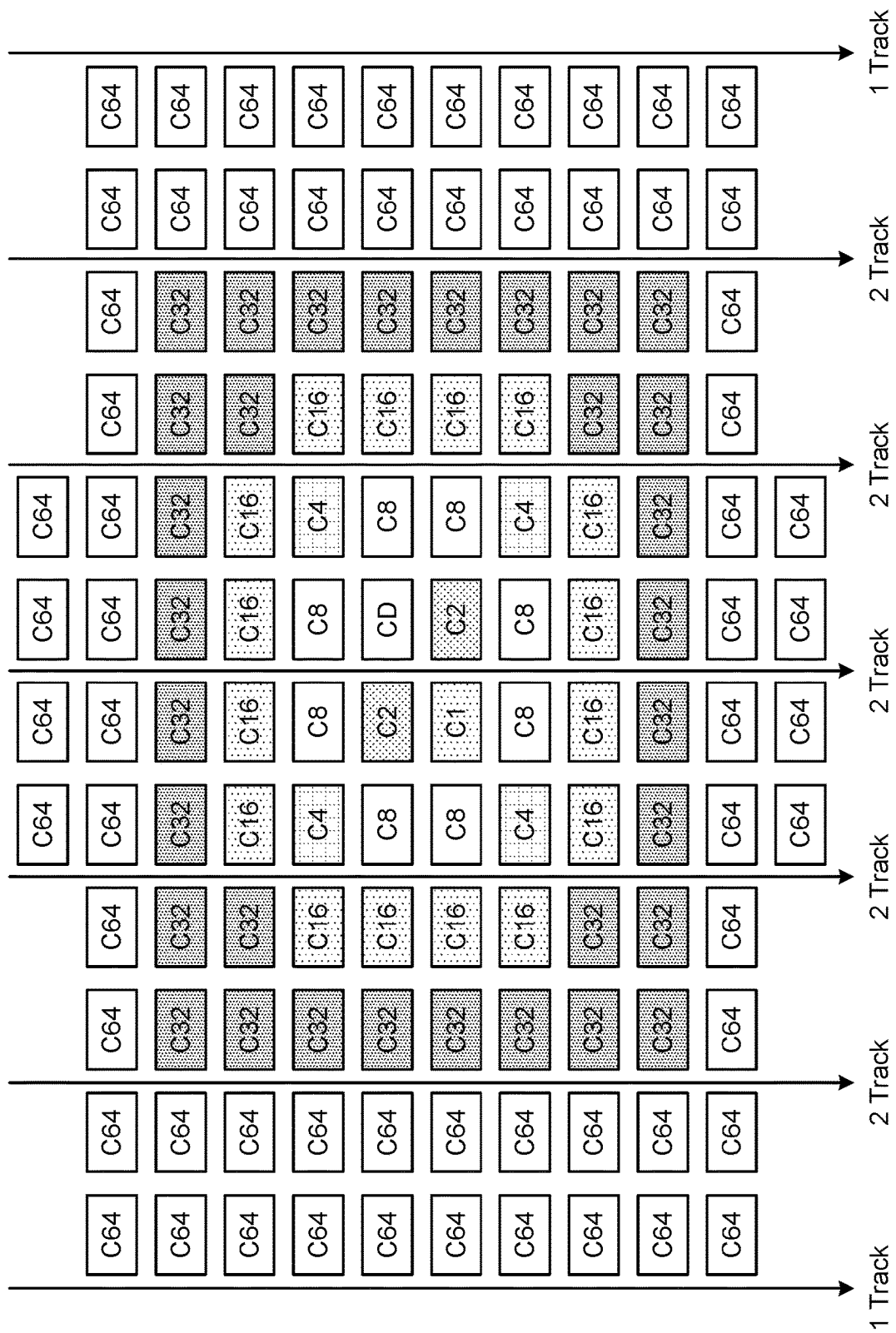

FIGS. 13A-13B are diagrams depicting layout matching patterns for the bank of capacitors of the CDAC circuitry 504 in accordance with some implementations. Each of the DACP and DACN correspond to a layout as depicted in FIG. 13A or 13B. The sixty-four capacitors labeled C64 in FIGS. 13A-13B correspond to 64C in one of the DACP or the DACN in FIG. 7, the thirty-two capacitors labeled C32 in FIGS. 13A-13B correspond to 32C in one of the DACP or the DACN in FIG. 7, and so forth. CD is a dummy capacitor.

The capacitor layouts depicted in FIGS. 13A-13B incorporate symmetries that minimize errors that could be caused by random offsets in capacitors due to process variations. By fixing layout-related errors, the DAC circuitry 504 may be more accurate. While there is a slight difference in aspect ratios between the two layouts depicted in the figures, the symmetry in each layout is maintained.

Stated another way, the DAC circuitry 504 includes a bank of capacitors arranged in a symmetric layout, including a plurality of capacitors having a first capacitance on a first side of the bank (e.g., the C64 capacitors on the left side, or on the top side) being spatially matched to a plurality of capacitors having the first capacitance on a second side of the bank (e.g., the C64 capacitors on the right side, or on the bottom side). Capacitors that are spatially matched are located the same distance from the center of the bank.

Signals may be routed among the capacitors in each layout using routing channels. FIGS. 13A-13B depict seven routing channels each, with some channels having one track and others having two tracks. The two layouts shown in the figures are illustrative of the concept of matching symmetries and are not meant to be limiting. As such, other layouts may be implemented. If such layouts maintain symmetries between similar capacitors as shown in the figures, then the improvements in accuracy can be achieved.

In some implementations, the capacitors of the CDAC circuitry 504 are DO-DO unit metal capacitors having a capacitance of approximately 3.9 fF-6 fF. In other embodiments, other capacitor types and values may be used, depending on the architecture and requirements of the temperature sensing circuitry 318.

Figure 14:
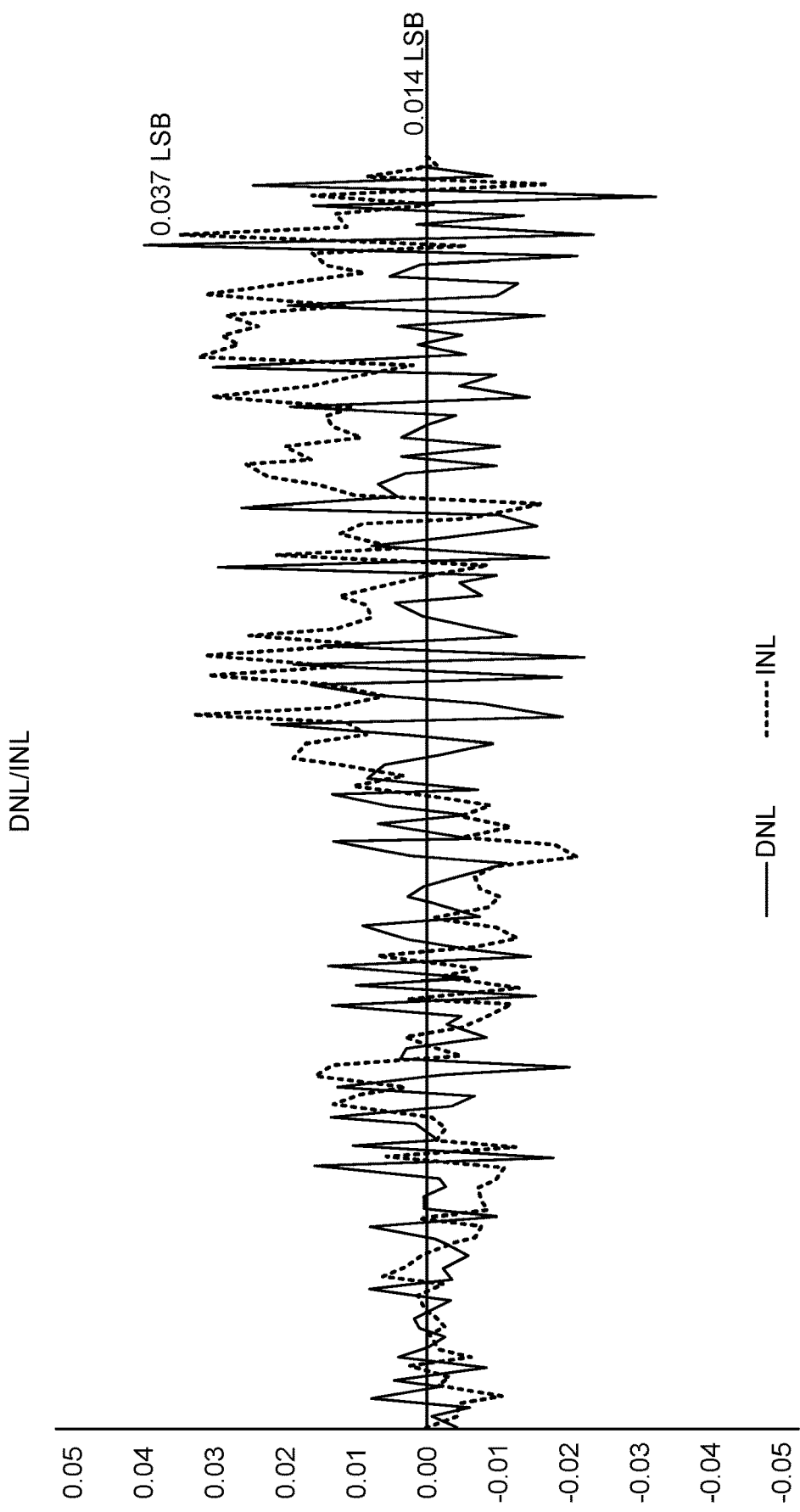
FIG. 14 is a graph depicting differential nonlinearity (DNL) and integral nonlinearity (INL) plots for the overall DAC resolution in accordance with some implementations.

FIG. 14 is a graph depicting differential nonlinearity (DNL) and integral nonlinearity (INL) plots for the overall DAC resolution in accordance with some implementations. As shown in the graph, use of the reference generation and trimming circuitry 508 and trimming method 900 as described herein results in the DNL/INL (which represent random errors) being within 0.5 LSB (least significant bit). Stated another way, the DNL/INL is small enough to represent a code accuracy of less than 0.5 LSB, which is advantageous.

To conclude, the reference generation and trimming circuitry 508 and trimming method 900 as described herein provide for low residual error in the temperature sensing circuitry 318 of a storage medium 104, which can lead to low DNL/INL random mismatches, resulting in high accuracy and good performance. In addition, the generation and trimming circuitry 508 and trimming method 900 as described herein provide for a single source VREF generation scheme, with all errors tracked and trimmed.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims.

For example, specific features of the exemplary embodiments may or may not be part of the claimed invention, different components as opposed to those specifically mentioned may perform at least some of the features described herein, and features of the disclosed embodiments may be combined.

As used herein, the terms "about" and "approximately" may refer to + or − 10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another.

For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims.

As used in the description of the implementations and the appended claims, the singular forms "a", "an" and "the" are intended to include the plural forms as well, unless the context clearly indicates otherwise.

It will also be understood that the term "and/or" as used herein refers to and encompasses any and all possible combinations of one or more of the associated listed items.

It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context.

Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A temperature sensing circuit of a data storage system, the temperature sensing circuit comprising:
    a temperature sensor configured to output an analog temperature signal proportional to a temperature proximate to a plurality of memory cells of the data storage system;

an analog-to-digital circuit (ADC) configured to convert the analog temperature signal to a digital temperature signal using a common mode voltage (VCM), a positive reference voltage (VREFP), and a negative reference voltage (VREFN); and a reference generation and trimming circuit configured to (i) generate the VCM, VREFP, and VREFN using a single band gap reference signal, and (ii) trim the VCM, VREFP, and VREFN by:
  adjusting a VC trim signal to increase the VCM until a VCM error is below a threshold;
  adjusting a high temperature trim signal to increase the VREFP and decrease the VREFN until the digital temperature signal attains a predetermined accuracy level for a first temperature; and
  adjusting a low temperature trim signal to increase the VREFP, VCM, and VREFN until the digital temperature signal attains a predetermined accuracy level for a second temperature.

2. The temperature sensing circuit of claim 1, wherein the ADC is configured to convert the analog temperature signal to the digital temperature signal by:
  determining whether the analog temperature signal is above or below VCM; and
  increasing VREFN in accordance with a determination that the analog temperature signal is above VCM or decreasing VREFP, or decreasing VREFP in accordance with a determination that the analog temperature signal is below VCM.

3. The temperature sensing circuit of claim 1, wherein the reference generation and trimming circuit is a loop of resistor ladders including a first resistor digital-to-analog conversion (RDAC) sub-circuit and a second RDAC sub-circuit in series with a negative feedback amplifier.

4. The temperature sensing circuit of claim 3, wherein the first RDAC is configured to trim the VREFP based on the high temperature trim signal, and the second RDAC is configured to trim the VREFN based on the high temperature trim signal.

5. The temperature sensing circuit of claim 3, wherein a portion of loop current outputted by the second RDAC is conveyed to a negative input terminal of the negative feedback amplifier.

6. The temperature sensing circuit of claim 1, wherein:
  the ADC is configured to convey the digital temperature signal to control circuitry of the data storage system; and
  the control circuitry of the data storage system is configured to bias a program voltage or a read voltage based on the digital temperature signal.

7. The temperature sensing circuit of claim 1, wherein the ADC includes a bank of capacitors arranged in a symmetric layout, including a plurality of capacitors having a first capacitance on a first side of the bank being spatially matched to a plurality of capacitors having the first capacitance on a second side of the bank.

8. A method of trimming reference voltage signals of a temperature sensing circuit of a data storage system including a temperature sensor configured to output an analog temperature signal proportional to a temperature proximate to a plurality of memory cells of the data storage system, and an analog-to-digital circuit (ADC) configured to convert the analog temperature signal to a digital temperature signal using a common mode voltage (VCM), a positive reference voltage (VREFP), and a negative reference voltage (VREFN), the method comprising:
  generating the VCM, VREFP, and VREFN using a single band gap reference signal; and
  trimming the VCM, VREFP, and VREFN, including:
    adjusting a VC trim signal to increase the VCM until a VCM error is below a threshold;
    adjusting a high temperature trim signal to increase the VREFP and decrease the VREFN until the digital temperature signal attains a predetermined accuracy level for a first temperature; and
    adjusting a low temperature trim signal to increase the VREFP, VCM, and VREFN until the digital temperature signal attains a predetermined accuracy level for a second temperature.

9. The method of claim 8, further comprising converting the analog temperature signal to the digital temperature signal by:
  determining whether the analog temperature signal is above or below VCM; and
  increasing VREFN in accordance with a determination that the analog temperature signal is above VCM or decreasing VREFP, or decreasing VREFP in accordance with a determination that the analog temperature signal is below VCM.

10. The method of claim 8, wherein the reference generation and trimming circuit is a loop of resistor ladders including a first resistor digital-to-analog conversion (RDAC) sub-circuit and a second RDAC sub-circuit in series with a negative feedback amplifier.

11. The method of claim 10, further comprising trimming the VREFP using the first RDAC based on the high temperature trim signal, and trimming the VREFN using the second RDAC based on the high temperature trim signal.

12. The method of claim 10, further comprising conveying a portion of loop current outputted by the second RDAC to a negative input terminal of the negative feedback amplifier.

13. The method of claim 8, further comprising:
  conveying by the ADC the digital temperature signal to control circuitry of the data storage system; and
  biasing at the control circuitry of the data storage system a program voltage or a read voltage based on the digital temperature signal.

14. A temperature sensing circuit of a data storage system, the temperature sensing circuit comprising:
  means for sensing a temperature and outputting an analog temperature signal proportional to a temperature proximate to a plurality of memory cells of the data storage system;
  means for converting the analog temperature signal to a digital temperature signal using a common mode voltage (VCM), a positive reference voltage (VREFP), and a negative reference voltage (VREFN); and
  means for (i) generating the VCM, VREFP, and VREFN using a single band gap reference signal, and (ii) trimming the VCM, VREFP, and VREFN by:
    adjusting a VC trim signal to increase the VCM until a VCM error is below a threshold;
    adjusting a high temperature trim signal to increase the VREFP and decrease the VREFN until the digital temperature signal attains a predetermined accuracy level for a first temperature; and
    adjusting a low temperature trim signal to increase the VREFP, VCM, and VREFN until the digital temperature signal attains a predetermined accuracy level for a second temperature.

15. The temperature sensing circuit of claim 14, wherein the means for converting the analog temperature signal to the digital temperature signal includes:
  means for determining whether the analog temperature signal is above or below VCM; and
  means for increasing VREFN in accordance with a determination that the analog temperature signal is above VCM or decreasing VREFP, or decreasing VREFP in accordance with a determination that the analog temperature signal is below VCM.

16. The temperature sensing circuit of claim 14, wherein the means for generating and trimming the VCM, VREFT, and VREFN include a loop of resistor ladders including a first resistor digital-to-analog conversion (RDAC) sub-circuit and a second RDAC sub-circuit in series with a negative feedback amplifier.

17. The temperature sensing circuit of claim 16, wherein the first RDAC is configured to trim the VREFP based on the high temperature trim signal, and the second RDAC is configured to trim the VREFN based on the high temperature trim signal.

18. The temperature sensing circuit of claim 16, wherein a portion of loop current outputted by the second RDAC is conveyed to a negative input terminal of the negative feedback amplifier.

19. The temperature sensing circuit of claim 14, further comprising:
  means for conveying the digital temperature signal to control circuitry of the data storage system; and
  means for biasing, at the control circuitry of the data system, a program voltage or a read voltage based on the digital temperature signal.

20. The temperature sensing circuit of claim 14, wherein the means for converting the analog temperature signal to the digital temperature signal include a bank of capacitors arranged in a symmetric layout, including a plurality of capacitors having a first capacitance on a first side of the bank being spatially matched to a plurality of capacitors having the first capacitance on a second side of the bank.

* * * * *